United States Patent [19]

Lai

[11] Patent Number: 5,027,319

[45] Date of Patent: Jun. 25, 1991

[54] GATE ARRAY MACRO CELL

[75] Inventor: Stephen W. Lai, Chandler, Ariz.

[73] Assignee: Motorola, Inc., Schaumburg, Ill.

[21] Appl. No.: 239,910

[22] Filed: Sep. 2, 1988

[51] Int. Cl.$^5$ .............................................. G11C 5/06
[52] U.S. Cl. .................... 365/156; 364/900;
 364/954.2; 364/959.1; 364/965.5
[58] Field of Search ............ 364/900 MS File, ;
 357/41, 45; 365/72, 104, 177, 156, 181, 189.08

[56] References Cited

U.S. PATENT DOCUMENTS

| 4,222,062 | 9/1980 | Trotter et al. | 357/45 |
| 4,724,531 | 2/1988 | Angleton et al. | 357/41 X |
| 4,779,231 | 10/1988 | Holzapfel et al. | 365/181 X |
| 4,851,892 | 7/1989 | Anderson et al. | 357/45 |
| 4,855,803 | 8/1989 | Azumai et al. | 365/156 X |
| 4,879,688 | 11/1989 | Turner et al. | 365/189.08 X |
| 4,884,115 | 11/1989 | Michel et al. | 357/45 X |

Primary Examiner—Thomas M. Heckler
Attorney, Agent, or Firm—Robert D. Atkins

[57] ABSTRACT

A gate array macro cell combines the functions of a single SRAM bit and two ROM bits in order to fully utilize all of the transistors in two CMOS gate array core cells, therein increasing the efficiency of implementing memory on a gate array. The SRAM is a six transistor memory cell and each ROM bit is provided by a P-channel field effect transistor. The SRAM and each ROM bit may be accessed separately since each bit is provided with its own word and bit lines.

12 Claims, 3 Drawing Sheets

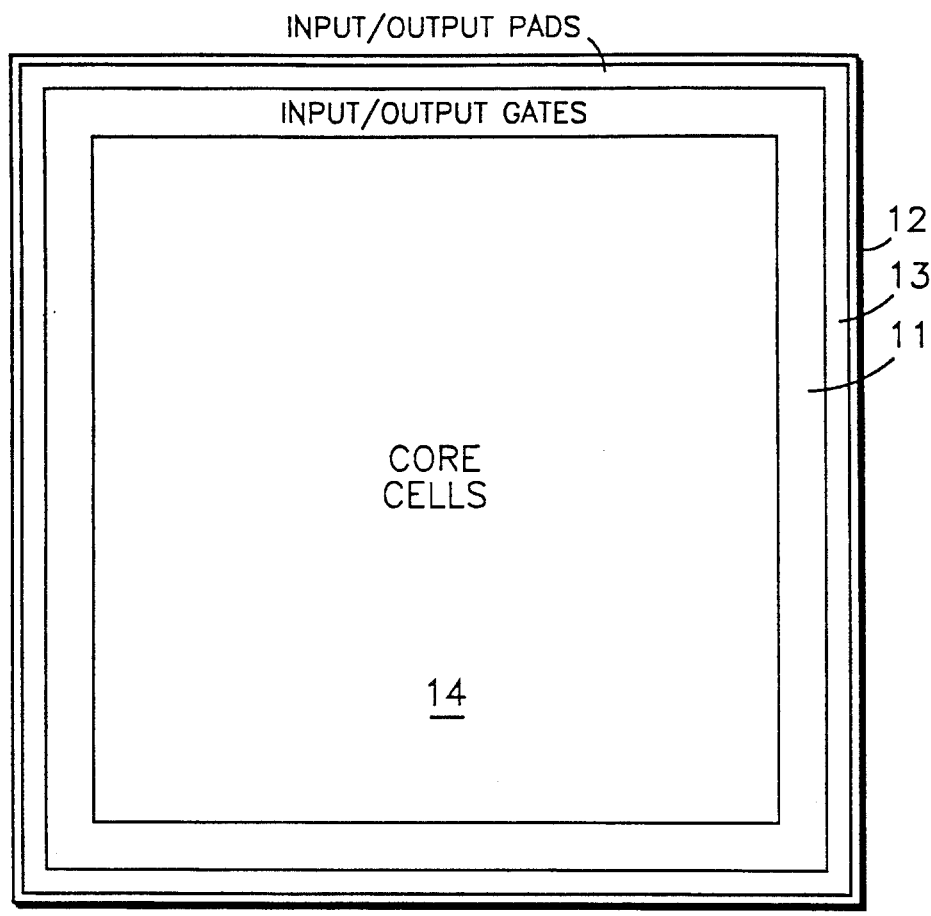
FIG. 1
FIG. 2
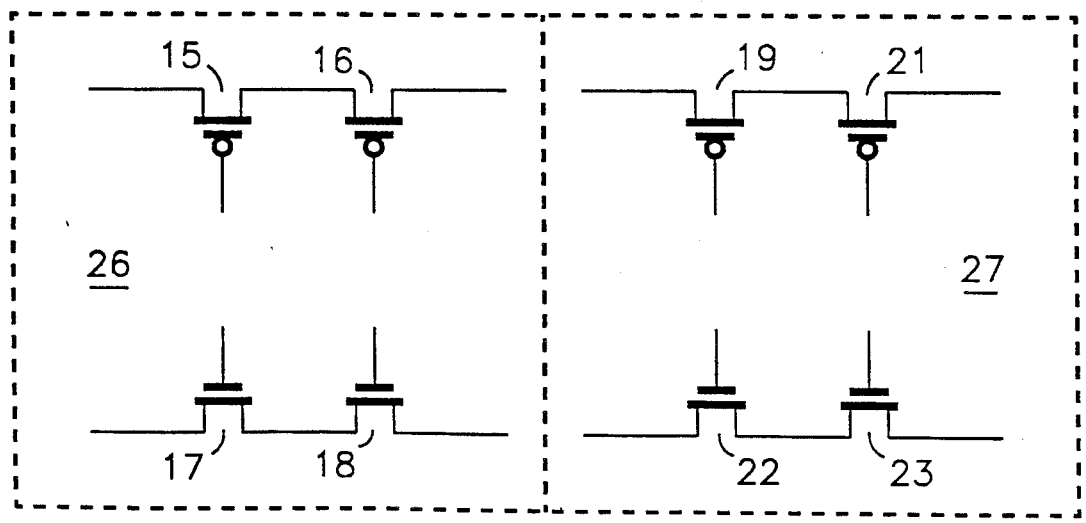

GATE ARRAY MACRO CELL

FIELD OF THE INVENTION

This invention relates in general to gate arrays and, more particularly, to a gate array macro cell having improved efficiency wherein a single SRAM bit is combined with two ROM bits to utilize all prediffused transistors in the core cell.

BACKGROUND OF THE INVENTION

To satisfy the demand for large scale digital integrated circuits, the semiconductor industry has developed three basic approaches. These include standard, off the shelf circuits, custom circuits, and semicustom circuits. The standard, off the shelf circuit provides the lowest cost option due to the quantities manufactured, but are limited in providing the flexibility for the circuit desired. The custom circuit requires a long design cycle and is cost limiting unless the number of circuits desired is large. The semicustom circuit includes both standard cell and gate array chips. The semicustom approach provides a shorter design cycle time and lower engineering costs, but also has lower performance and transistor densities than the custom designs.

The gate array involves a standard array of a large number of predefined transistors diffused into a chip. The building block of the array is the core cell which typically includes two, four, or eight transistors arranged for maximum connectivity for forming many circuit functions. These core cells are then arranged in a plurality of rows and columns to form the array. In addition to the array, the periphery of the gate array is defined by input/output cells wherein the transistors are also predefined. A macro cell library is also designed which defines the metallization patterns necessary to interconnect the transistors within one or more core cells to form basic logic functions such as inverters, Nand and Nor gates, flip-flops, input and output cells, etc. A customer defines a design for the gate array by using macros from the macro cell library and specifying their interconnection to form the desired system functions.

The advantage of the gate array approach is in its low cost and short cycle time. And with product lifetimes decreasing there is tremendous pressure to reduce design and manufacturing times. The cost savings come from reduced engineering requirements and fewer custom mask sets required. This is because many wafers are processed up to the transistor level and then stored until they are needed for a customers design. In this way all customers share the cost of the masks required to process up to the transistor level in which case the cost becomes negligible. And since the transistors are predefined, it is not necessary to custom design and layout each of thousands of transistors. Time is saved both in design time and manufacturing since less engineering is required and the majority of the processing has been completed before a design is undertaken.

There are several disadvantages associated with the gate array design approach including lower transistor density due to inefficient transistor layout and many unused transistors which results in a larger chip, and lower performance. The cost per chip is higher, but for low volumes this is offset by the much lower engineering costs. As gate arrays evolve into larger die with more transistors it becomes possible to realize more complex systems on chip. This increases the need for more specialized macros with greater efficiency (i.e. less unused transistors). A specific problem is that of supplying memory efficiently on the gate array.

In providing Static Random Access Memory (SRAM) two options are available: providing a dedicated memory block on the chip, therein providing improved density and performance at a cost of flexibility; or providing a SRAM cell in the macro cell library which is flexible but inefficient (i.e., in a four transistor core cell, two core cells are required to implement a six transistor SRAM and thus wastes 2 transistors or 25 percent of the area). The same options and problems exist for providing Read Only Memory (ROM) on the gate array except that the problem is exacerbated by the fact that only P or N-channel transistors could be used in the ROM array, thus wasting 50 percent of the transistors in the core cells implementing the ROM array.

Thus, what is needed is a gate array macro cell having improved efficiency wherein a single SRAM bit is combined with two ROM bits to utilize all prediffused transistors in the core cell.

SUMMARY OF THE INVENTION

Accordingly, it is an object of the present invention to provide an improved gate array macro cell.

It is a further object of the present invention to provide a gate array macro cell having combined SRAM and ROM memory functions.

Still it is another object of the present invention to provide a gate array macro cell having combined SRAM and ROM memory functions wherein the SRAM and ROM memory bits may be accessed independently.

It is yet another object of the present invention to provide a gate array macro cell having combined SRAM and ROM memory functions wherein each transistor of the macro cell is utilized.

It is yet still a further object of the present invention to provide an improved method of implementing SRAM and ROM on a gate array.

In carrying out the above and other objects of the invention in one form, there is provided a macro cell having a SRAM storage cell in combination with first and second ROM storage cells wherein in each of the SRAM and first and second ROM storage cells has its own word lines and bit lines. The macro cells comprises a first gate array core cell having first and second P-channel and first and second N-channel field effect transistors; a second gate array core cell having first and second P-channel and first and second N-channel field effect transistors; a first plurality of metallization patterns for coupling the first and second P-type transistors of the first core cell, and the first and second N-type transistors of the first and second core cells for providing the static RAM storage cell; and a second plurality of metallization patterns for coupling the first and second P-type transistors of the second core cell for providing the first and second ROM storage cells.

The above and other objects, features, and advantages of the present invention will be better understood from the following detailed description taken in conjunction with the accompanying drawings.

BRIEF DESCRIPTION OF THE DRAWING

FIG. 1 shows a top view of a gate array in block form.

FIG. 2 shows a schematic of a pair of gate array core cells.

DETAILED DESCRIPTION OF THE INVENTION

Figure 3:
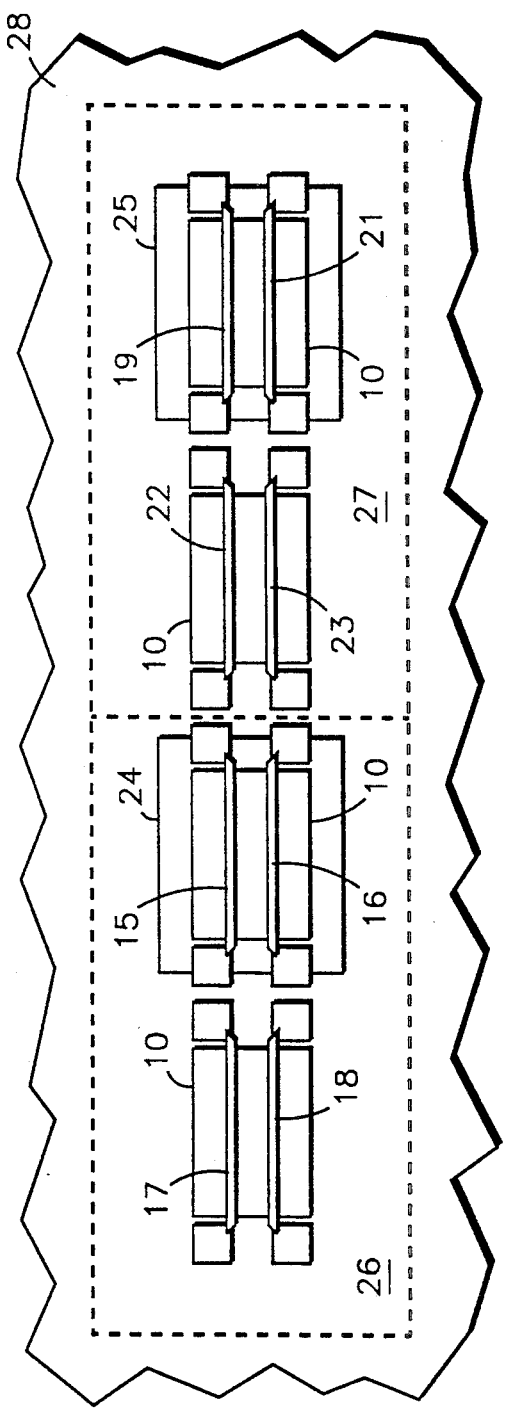
FIG. 3 shows a schematic cross-sectional plan view of two adjacent gate array core cells before metallization.

A gate array integrated circuit which may be customized to perform specified system functions is shown in FIG. 1. The gate array typically includes a plurality of input/output gates 11 around the periphery of a chip 12 and which are coupled between one of a plurality of input/output pads 13 and a plurality of core cells 14. The core cells 14 are typically arranged on an internal portion of the chip 12 in an array of rows and columns and comprise standard functions including combinatorial and sequential logic and other special functions including memory.

Referring to FIG. 2, two core cells 26 and 27 of the plurality of core cells 14 are shown schematically. The core cells 26 and 27 are shown as they are manufactured on chip before metallization for interconnection of the transistors and intraconnection of the core cells. The core cell 26 includes two P-channel field effect transistors 15 and 16 having their source-drain current paths connected in series, and two N-channel field effect transistors 17 and 18 having their source-drain current paths connected in series. The core cell 27 is identical to the core cell 26 and includes field effect transistors 19, 21, 22, and 23. The field effect transistors 15, 16, 17, 18, 19, 21, 22, and 23 do not have their gates connected to another element. The core cells 26 and 27 are well known in the art and are further described in T. Wong et al, "A High Performance 129K Gate CMOS Array," IEEE 1986 Custom Integrated Circuits Conference, pp. 568–569.

In FIG. 3, a schematic cross-sectional plan of the core cells 26 and 27 is illustrated at the level before contacts and metallization are added. Structures of FIG. 3 which are shown in FIG.2 are identified by the numbers in FIG. 2. N-wells 24 and 25 are diffused into a P-type substrate 28 followed by the deposition of the gates of the field effect transistors 15, 16, 17, 18, 19, 21, 22, and 23, and the diffusion of active areas 10 in a manner well known to those skilled in the art. The field effect transistors of the core cells 26 and 27 are arranged in a manner which allows the transistors to be coupled together by the metallization patterns and contacts into many different circuit configurations. When the transistors are interconnected to form a logic function, they are said to be personalized. The different metal and contact patterns used to define the interconnections are known as the macro cells.

The macro cell library is a collection of macro cells which define a wide variety of functions. A macro cell may require only one core cell as in a two input Nand gate, or it may require many core cells as in a 4-bit adder. A major goal of the designer of a macro cell library is to obtain a high efficiency ratio which is a measure of how many transistors in each core cell are actually used (interconnected and providing functionality) in the personalization. For example, the two input Nand gate requires four transistors and, therefor, one core cell can be used resulting in an efficiency of 100 percent. But a three input Nand gate requires 6 transistors provided by two core cells having 8 transistors available and resulting in an efficiency of 6/8 or 75 percent.

As gate arrays have increased in size, there has been more demand for new functions including memory. When more functions are available, the functionality of a gate array may be increased and thus fewer chips are required in a system resulting in more competitive products. Providing memory options on a gate array in the past have included dedicated memory arrays in addition to the core cell array and offering memory cells in the macro cell library. A significant draw back to the macro cell approach has been the inefficiency associated with the SRAM. This SRAM macro cell requires six transistors and so has an efficiency of 75 percent. When providing significant amounts of memory this results in a large percentage of the gate array being unusable.

Figure 4:
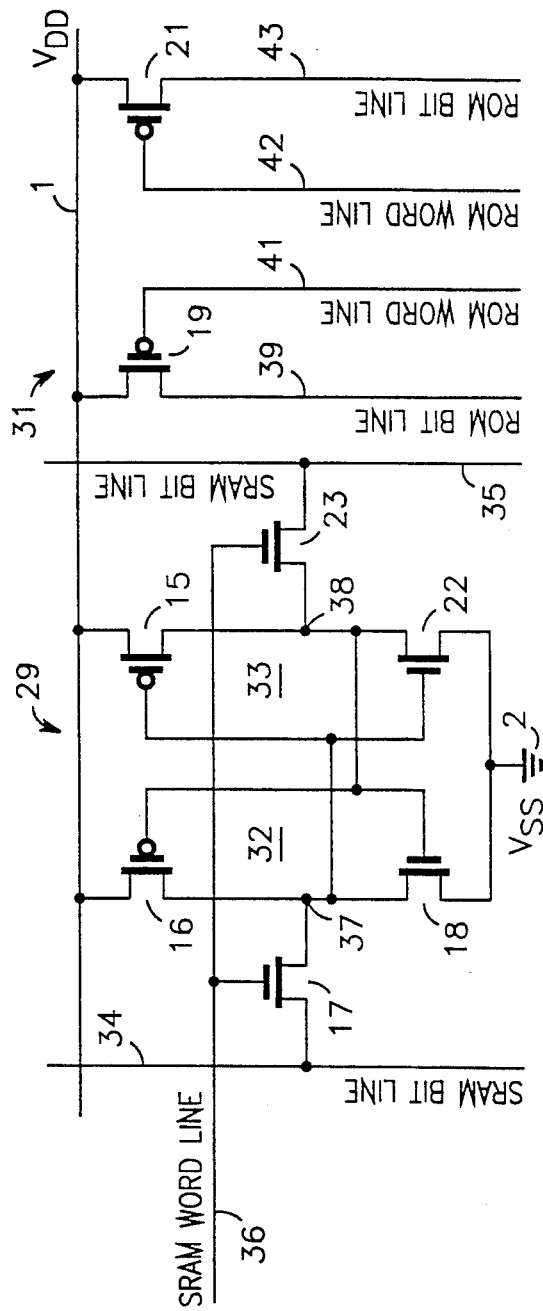
FIG. 4 is a schematic diagram of a merged SRAM and two ROM memory cells.

A solution to this inefficiency is illustrated in FIG. 4 where a SRAM cell 29 is shown combined with a ROM function 31. The combination memory cell requires eight transistors and can be implemented in two core cells resulting in an efficiency of 100 percent. Again, structures of FIG. 4 which are shown in FIG. 3 are identified by the numbers in FIG. 3. The six transistor SRAM cell 29 comprises two inverters 32 and 33, and two pass transistors comprised of the field effect transistors 17 and 23. The field effect transistors 15 and 16 have their sources connected to the supply voltage bus 1, their drains connected to nodes 37 and 38, respectively, and their gates connected to the nodes 38 and 37, respectively. The field effect transistors 18 and 22 have their sources connected to the supply voltage bus 2, their drains connected to the nodes 37 and 38, respectively, and their gates connected to the nodes 38 and 37, respectively. The field effect transistor 17 has a source connected to the node 37, a gate connected to a SRAM word line 36, and a drain connected to a SRAM bit line 34. The field effect transistor 23 has a source connected to the node 38, a gate connected to the SRAM word line 36, and a drain connected to a SRAM bit line 35.

The six transistor SRAM configuration as depicted by the SRAM 29 is widely known and used in the industry and works well in the gate array core cell implementation wherein all transistors have the same channel lengths and channel widths. In operation, a single data bit is stored in the cell by bringing the SRAM word line 36 high and forcing the SRAM bit line 35 low or high depending on the state of the data bit being stored. The SRAM word line is then brought low and the inverters 32 and 33 will latch and store the written data bit. Upon reading the data bit from the SRAM cell 29, the SRAM word line 36 is brought high allowing the stored data bit to control the level of the SRAM bit lines 34 and 35 through the pass transistors 17 and 23, respectively. By the action of the two inverters 32 and 33, and depending on the state of the stored data bit, one of the SRAM bit lines 34 and 35 will go high and the other will go low.

The ROM function 31 comprises the field effect transistors 19 and 21 therein providing the storage of two data bits. The field effect transistor 19 has a source connected to the supply voltage bus 1, a gate connected to the ROM word line 41, and a drain connected to the ROM bit line 39. The field effect transistor 21 has a source connected to the supply voltage bus 1, a gate connected to the ROM word line 42, and a drain connected to the ROM bit line 43. The connection of the sources of the field effect transistors 19 and 21 to the supply voltage bus 1 is programmable. If a logical 1 is to be stored in a ROM location, then the source is connected to the supply voltage bus 1 as previously described. For example, if the ROM word line 41 is brought low, the field effect transistor 19 is selected and will conduct to bring the ROM bit line 39 high. If a logical zero were to be stored in the ROM location, the source is left floating or unconnected. For example, if the ROM word line 41 is again brought low, the field effect transistor 19 is selected but will not connect the word line 39 to the supply voltage bus 1. A pulldown device in the ROM decoders will ensure the ROM bit line 39 is pulled down to a logical 0.

Figure 5:
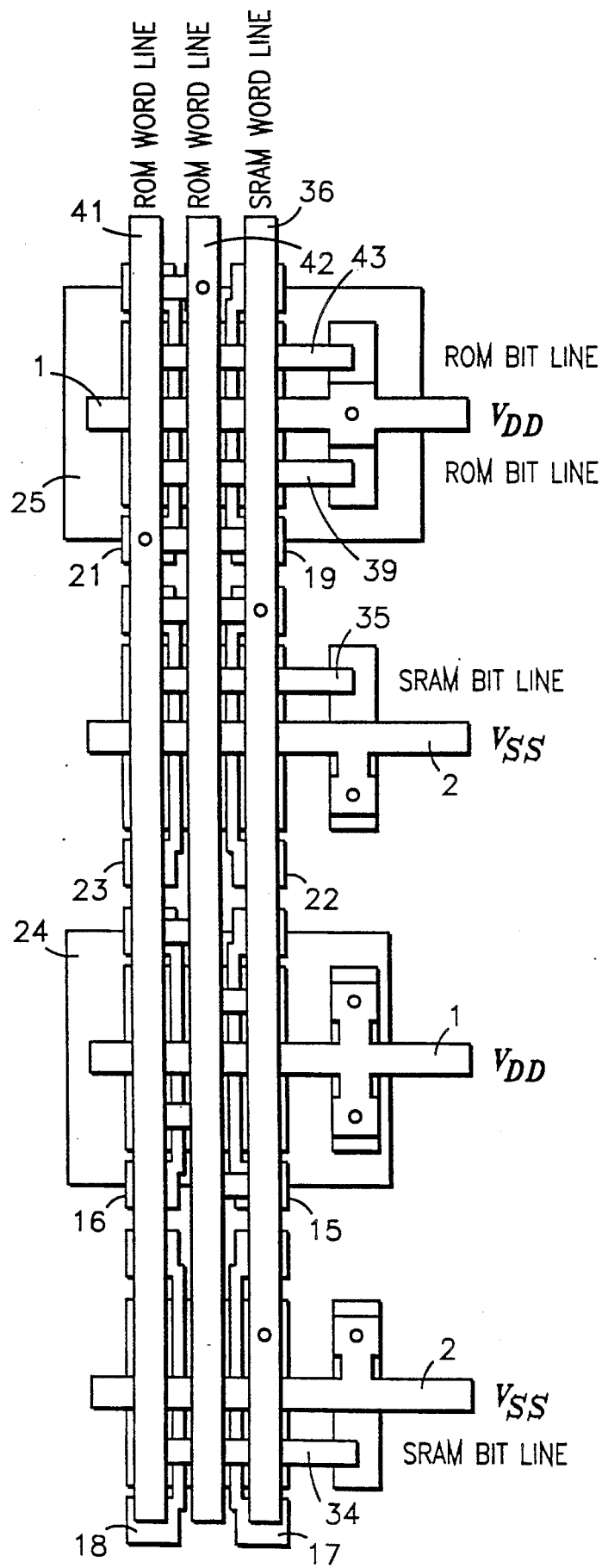
FIG. 5 shows the gate array core cells of FIG. 3 including a first and second layer of metal to provide a macro cell of the merged SRAM and ROM cells.

An advantage of the merged SRAM 29 and ROM function 31 as shown in FIG. 4 is the ability to decode the SRAM bit separately from either of the ROM bits. This is possible due to each memory bit having its own bit and word lines. The result is the capability of having two independent memories (SRAM and ROM) on a gate array in the same area previously required for providing only the SRAM. FIG. 5 shows a possible macro cell implementation of the merged SRAM 29 and ROM function 31 shown in FIG. 4. The macro cell shown in FIG. 5 comprises 4 personalization layers including contact, first metal, via, and second metal.

By now it should be appreciated that there has been provided a gate array macro cell having improved efficiency wherein a single SRAM bit is combined with two ROM bits to utilize all prediffused transistors in the core cell.

I claim:

1. A semicustom integrated circuit having a plurality of core cells, each of said plurality of core cells having a plurality of transistors, said semicustom integrated circuit comprising:
   first means for interconnecting a first portion of the plurality of transistors of one of the plurality of core cells in a predetermined manner for providing a first type of memory cell; and
   second means for interconnecting the remaining portion of the plurality of transistors of said one of the plurality of core cells in a predetermined manner for providing at least one second type of memory cell.

2. The semicustom integrated circuit according to claim 1 wherein said first means further comprises a plurality of metallization patterns coupled to said first portion of the plurality of transistors for providing said first type of memory cell.

3. The semicustom integrated circuit according to claim 2 wherein said second means further comprises a plurality of metallization patterns coupled to said remaining portion of the plurality of transistors for providing said at least one second type of memory cell.

4. The semicustom integrated circuit according to claim 3 wherein said first type of memory cell and said at least one second type of memory cell may each be accessed individually.

5. The semicustom integrated circuit according to claim 4 wherein said plurality of transistors comprises CMOS transistors.

6. A gate array core cell comprising:
   a first supply voltage bus for receiving a first supply voltage;
   a second supply voltage bus for receiving a second supply voltage;
   a first bit line;
   a second bit line
   a third bit line;
   a fourth bit line;
   a first word line;
   a second word line;
   a third word line;
   a first field effect transistor having a drain coupled to said first bit line, a gate coupled to said first word line, and having a source;
   a second field effect transistor having a drain coupled to said second bit line, a gate coupled to said first word line, and having a source;
   a third field effect transistor having a source coupled to said first supply voltage bus, a gate coupled to the source of said second field effect transistor, and a drain coupled to said source of said first field effect transistor;
   a fourth field effect transistor having a source coupled to said second supply voltage bus, a gate coupled to the source of said second field effect transistor, and a drain coupled to the source of said first field effect transistor;
   a fifth field effect transistor having a source coupled to said first supply voltage bus, a gate coupled to the source of said first field effect transistor, and a drain coupled to the source of said second field effect transistor;
   a sixth field effect transistor having a source coupled to said second supply voltage bus, a gate coupled to the source of said first field effect transistor, and a drain coupled to the source of said second field effect transistor;
   a seventh field effect transistor having a source selectively coupled to said first supply voltage bus, a gate coupled to said second word line, and a drain coupled to said third bit line; and
   an eighth field effect transistor having a source selectively coupled to said first supply voltage, a gate coupled to said third word line, and a drain coupled to said fourth bit line.

7. A semicustom integrated circuit including a plurality of core cells, each of said plurality of core cells having a plurality of transistors, one of the plurality of core cells comprising:
   a first type of memory cell utilizing a first portion of the plurality of transistors of one of the plurality of core cells coupled in a predetermined manner for providing data storage and retrieval operations, said first type of memory cell utilizing less than the available number of the plurality of transistors of one of the plurality of core cells; and
   at least one second type of memory cell utilizing a second portion of the plurality of transistors of one of the plurality of core cells coupled in a predetermined manner for providing data retrieval operations, said first and second types of memory cells substantially utilizing the plurality of transistors of one of the plurality of core cells.

8. The semicustom integrated circuit according to claim 7 wherein said at least one second memory cell includes a first transistor having a gate, a source and a drain, said gate being coupled for receiving a first word line signal, said drain being coupled for receiving a first bit line signal.

9. The semicustom integrated circuit according to claim 8 wherein said source of said first transistor is coupled to a first power supply conductor.

10. The semicustom integrated circuit according to claim 8 wherein said source of said first transistor is open-circuited.

11. The semicustom integrated circuit according to claim 8 wherein said first type of memory cell includes:
- a second transistor having a gate, a source and a drain, said gate being coupled for receiving a second word line signal, said drain being coupled for receiving a second bit line signal;
- a third transistor having a gate, a source and a drain, said source being coupled to a first power supply conductor, said drain being coupled to said source of said second transistor;
- a fourth transistor having a gate, a source and a drain, said drain being coupled to said drain of said third transistor, said source being coupled to a second power supply conductor, said gate being coupled to said gate of said third transistor;
- a fifth transistor having a gate, a source and a drain, said source being coupled to said power supply conductor;
- a sixth transistor having a gate, a source and a drain, said source being coupled to said second power supply conductor, said drains of said fifth and sixth transistors being coupled together to said gates of said third and fourth transistors, said gates of said fifth and sixth transistors being coupled to said source of said second transistor; and
- a seventh transistor having a gate, a source and a drain, said source being coupled to said drains of said fifth and sixth transistors, said gate being coupled for receiving said second word line signal, said drain being coupled for receiving a third bit line signal.

12. A method of combining a first type of memory cell and at least one second type of memory cell on a semicustom integrated circuit including a plurality of core cells, each of said plurality of core cells having a plurality of transistors, comprising the steps of:
- allocating a first portion of the plurality of transistors of one of the plurality of core cells and interconnecting said first portion of the plurality of transistors in a predetermined manner via a first plurality of metallization patterns for providing data storage and retrieval operations of the first type of memory cell, said first type of memory cell utilizing less than the available number of the plurality of transistors of one of the plurality of core cells; and
- allocating a second portion of the plurality of transistors of one of the plurality of core cells and interconnecting said second portion of the plurality of transistors in a predetermined manner via a second plurality of metallization patterns for providing data retrieval operations of the at least one second type of memory cell, said first and second types of memory cells substantially utilizing the plurality of transistors of one of the plurality of core cells.

* * * * *